United States Patent
Zhou et al.

(10) Patent No.: US 11,367,391 B2
(45) Date of Patent: Jun. 21, 2022

(54) DISPLAY PANEL, DISPLAY DEVICE AND DETECTION METHOD

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Da Zhou, Beijing (CN); Taoran Zhang, Beijing (CN); Zailong Mo, Beijing (CN); Wenjun Liao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 394 days.

(21) Appl. No.: 16/473,120

(22) PCT Filed: Dec. 29, 2018

(86) PCT No.: PCT/CN2018/125194
§ 371 (c)(1),
(2) Date: Jun. 24, 2019

(87) PCT Pub. No.: WO2019/205709
PCT Pub. Date: Oct. 31, 2019

(65) Prior Publication Data
US 2021/0335974 A1    Oct. 28, 2021

(30) Foreign Application Priority Data
Apr. 26, 2018 (CN) .......................... 201810385999.4

(51) Int. Cl.
*H01L 27/32* (2006.01)
*G09G 3/3233* (2016.01)
*G09G 3/00* (2006.01)

(52) U.S. Cl.
CPC ............. *G09G 3/3233* (2013.01); *G09G 3/00* (2013.01); *G09G 3/006* (2013.01); *H01L 27/3276* (2013.01); *G09G 2330/12* (2013.01)

(58) Field of Classification Search
CPC .. H01L 27/3276; G09G 3/006; G09G 3/3233; G09G 2330/12
See application file for complete search history.

(56) References Cited

U.S. PATENT DOCUMENTS

| 8,581,863 B2 | 11/2013 | Sasaki et al. |
| 8,633,874 B2 | 1/2014 | Matsui |

(Continued)

FOREIGN PATENT DOCUMENTS

| CN | 101900903 A | 12/2010 |
| CN | 102388414 A | 3/2012 |

(Continued)

OTHER PUBLICATIONS

First Chinese Office Action from priority Chinese Application No. 201810385999.4 dated May 13, 2020.

(Continued)

*Primary Examiner* — Mark W Regn
(74) *Attorney, Agent, or Firm* — Dilworth & Barrese, LLP.; Michael J. Musella, Esq.

(57) ABSTRACT

A display panel, a display device and a detection method are provided. The display panel includes a display area and a peripheral area surrounding the display area. Pixel units arranged in an array are disposed in the display area. The pixel unit includes a pixel driving circuit. A crack detecting line is disposed in the peripheral area, and the crack detect- (Continued)

ing line is connected to a reset signal terminal of the pixel driving circuit of at least one pixel unit. The display panel can reduce the influence of the voltage drop over the crack detection line on the brightness during the electrical detection stage, and can also improve the crack detection rate of the peripheral area.

20 Claims, 8 Drawing Sheets

(56) References Cited

U.S. PATENT DOCUMENTS

| | | | |
|---|---|---|---|
| 8,823,891 | B2 | 9/2014 | Kim et al. |
| 9,767,727 | B2 | 9/2017 | Byun et al. |
| 9,875,676 | B2 | 1/2018 | Byun et al. |
| 2004/0080475 | A1 | 4/2004 | Yoshida |
| 2011/0025678 | A1 | 2/2011 | Chung |
| 2011/0080173 | A1 | 4/2011 | Kim et al. |
| 2014/0176844 | A1 | 6/2014 | Yanagisawa |
| 2016/0225312 | A1* | 8/2016 | Byun .................. G09G 3/006 |
| 2016/0293078 | A1 | 10/2016 | Byun |
| 2017/0192065 | A1 | 7/2017 | Lee et al. |
| 2017/0294166 | A1 | 10/2017 | Kim et al. |
| 2018/0053792 | A1 | 2/2018 | Shin et al. |

FOREIGN PATENT DOCUMENTS

| | | |
|---|---|---|
| CN | 105679215 A | 6/2016 |
| CN | 105869551 A | 8/2016 |
| CN | 106257571 A | 12/2016 |
| CN | 107680481 A | 2/2018 |
| CN | 107871764 A | 4/2018 |
| JP | 2007164087 A | 6/2007 |
| KR | 20110121844 A | 11/2011 |
| KR | 20160095313 A | 8/2016 |
| KR | 20160148834 A | 12/2016 |

OTHER PUBLICATIONS

International Search Report and Written Opinion dated Mar. 28, 2019 from State Intellectual Property Office of the P.R. China (ISA/CN).
First Korean Office Action from Korean Patent Application No. 10-2019-7027470 dated Aug. 11, 2020.
Extended European Search Report from European Patent Application No. 18889949.6 dated Dec. 8, 2021.

* cited by examiner

DISPLAY PANEL, DISPLAY DEVICE AND DETECTION METHOD

The present application claims priority of the Chinese Patent Application No. 201810385999.4, filed on Apr. 26, 2018, the entire disclosure of which is incorporated herein by reference as part of the present application.

TECHNICAL FIELD

Embodiments of the present disclosure relate to a display panel, a display device and a detection method.

BACKGROUND

In organic light-emitting diode (OLED) display products, a thin film encapsulation (TFE) process is widely used. The typical packaging defect that may be generated in the encapsulation process is package leakage, which causes organic light-emitting materials to contact the external water vapor and causes the organic light-emitting material to fail. The root cause of the package leakage is the occurrence of cracking in a film layer(s), which causes the package film to crack.

In an electrical detection stage, if only a slight crack occurs in the film layer(s) but no obvious crack occurs in the package film, the display panel will not present defects when it is lit. However, after long-term use or a high-temperature reliability test, slight cracks in the film layer may grow and deteriorate, which may cause the risk for the failure of the organic light-emitting material or even the scrap of the display panel. Therefore, it is necessary to have the products with cracks in the film layer to be selected out in time in the electrical detection stage to avoid further material waste.

SUMMARY

At least one embodiment of the present disclosure provides a display panel, which includes a display area and a peripheral area surrounding the display area, pixel units arranged in an array are disposed in the display area, the pixel unit includes a pixel driving circuit, a crack detection line is disposed in the peripheral area, and the crack detection line is connected to a reset signal terminal of the pixel driving circuit of at least one pixel unit.

For example, in the display panel provided by an embodiment of the present disclosure, the pixel driving circuit includes a reset circuit having the reset signal terminal and includes a light-emitting circuit connected to the reset circuit, the reset circuit is configured to receive from the crack detection line a crack detection signal to cause the light-emitting circuit to emit light.

For example, in the display panel provided by an embodiment of the present disclosure, the pixel driving circuit further includes a driving circuit, and the driving circuit is configured to control a driving current for driving the light-emitting circuit to emit light.

For example, in the display panel provided by an embodiment of the present disclosure, the crack detection line is disposed around the display area.

For example, in the display panel provided by an embodiment of the present disclosure, the crack detection line includes a snake-shaped line portion.

For example, in the display panel provided by an embodiment of the present disclosure, a plurality of the crack detection lines are disposed in different regions of the peripheral area, and the plurality of the crack detection lines are respectively connected to the reset signal terminals of the pixel driving circuits of different pixel units.

For example, in the display panel provided by an embodiment of the present disclosure, the reset signal terminals of pixel driving circuits of at least one row of the pixel units are all connected to a first reset signal line, and the first reset signal line is connected to the crack detection lines.

For example, in the display panel provided by an embodiment of the present disclosure, the crack detection line includes a first portion away from the display area and a second portion proximate to the display area, the first portion and the second portion are parallel with each other, and the first reset signal line is connected to the second portion of the crack detection line.

For example, in the display panel provided by an embodiment of the present disclosure, in the display area, except the at least one row of the pixel units electrically connected to the crack detection line, each row of pixel units is correspondingly provided with a second reset signal line, and the second reset signal line is connected to reset signal terminals of pixel driving circuits of the row of pixel units.

For example, in the display panel provided by an embodiment of the present disclosure, the crack detection line includes a crack detection terminal disposed on one side of a bonding area in the peripheral area, and the crack detection terminal is configured to receive a crack detecting signal, and the first reset signal line is closer to the crack detection terminal than the second reset signal line.

For example, the display panel provided by an embodiment of the present disclosure further includes a reset common line, and the reset common line is connected to the second reset signal line.

For example, in the display panel provided by an embodiment of the present disclosure, the reset common line is connected to the crack detection terminal.

For example, in the display panel provided by an embodiment of the present disclosure, the crack detection line is provided in a gate metal layer, a source-drain metal layer of a driving transistor of the pixel driving circuit.

At least one embodiment of the present disclosure further provides a display device including a display panel provided in an embodiment of the present disclosure.

At least one embodiment of the present disclosure further provides a detection method for the display panel provided in an embodiment of the present disclosure. The method includes: providing the crack detection signal to the reset signal terminal of the pixel driving circuit in the at least one pixel unit through the crack detection line; and observing whether the display panel presents a dark line during display.

For example, the detection method provided by an embodiment of the present disclosure further includes: in a case where the display panel includes the first reset signal line, the crack detection signal is supplied to the reset signal terminal of the pixel unit not connected to the first reset signal line.

For example, the detection method provided by an embodiment of the present disclosure further includes: in a case where the pixel driving circuit includes a reset circuit having the reset signal terminal and includes a light-emitting circuit connected to the reset circuit, a reset control signal is provided to turn on the reset circuit, and the crack detection signal is provided to the light-emitting circuit by the reset circuit.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art may obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "compris- ing," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
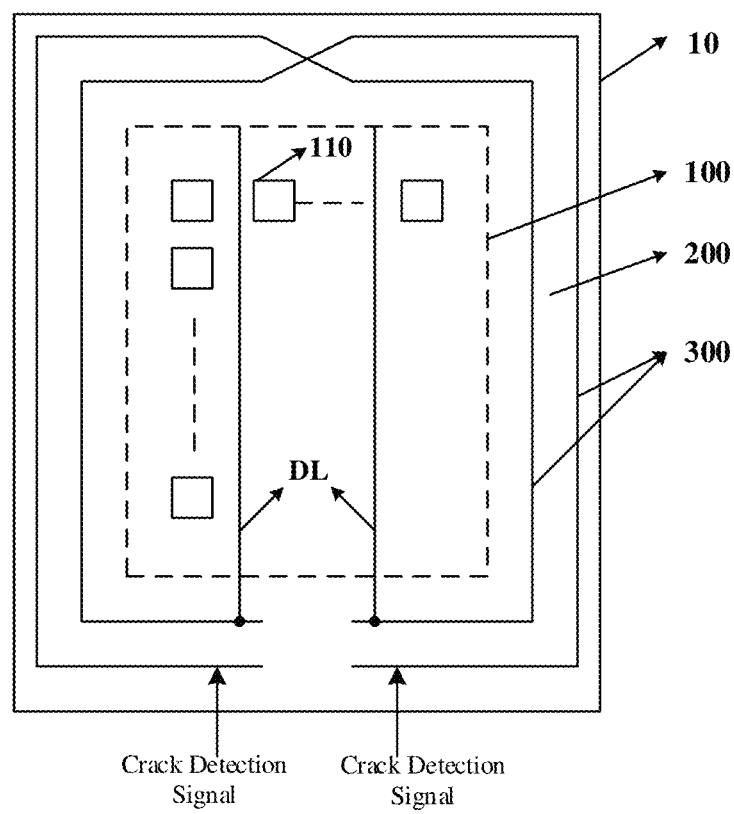
FIG. 1 is a schematic diagram of a display panel in which a crack detection line is connected with a portion of data lines.
Figure 2:
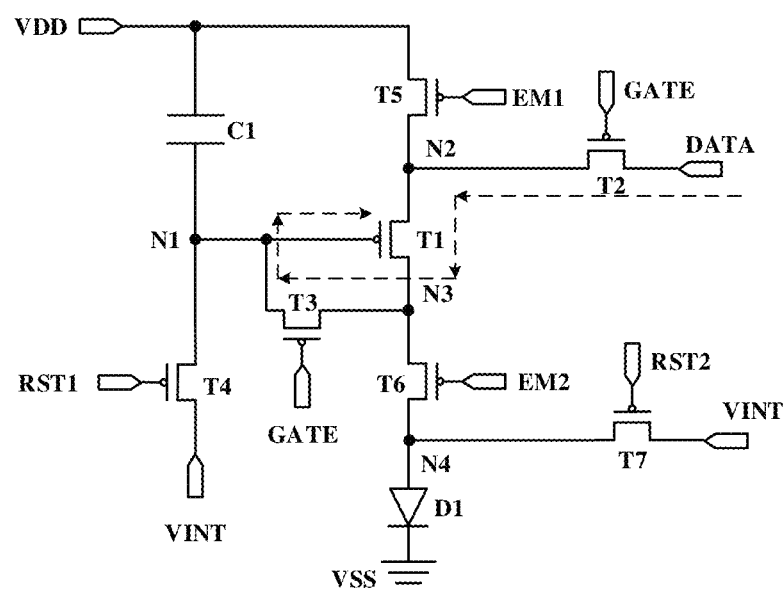
FIG. 2 is a schematic diagram of a pixel driving circuit in a data writing stage.

As shown in FIG. 1, a display panel 10 includes a display area 100 and a peripheral area 200 surrounding the display area 100. In the display area 100, pixel units 110 are provided in an array; and the peripheral area is used for routing various kinds of wires, bonding the driver chips and realizing the encapsulation of the display panel. The pixel unit 110 includes a pixel driving circuit; for example, various suitable types of pixel driving circuits such as 7T1C (i.e., seven transistors T1 to T7 and one storage capacitor C1) shown in FIG. 2 may be employed.

In the display panel 10 shown in FIG. 1, a crack detection line 300 is provided in the peripheral area 200, and the crack detection line 300 is connected to a portion of the data lines DL in the display panel 10 (two data lines DL connected to the crack detection line 300 are only showed in FIG. 1 as an example). Taking the pixel driving circuit shown in FIG. 2 as an example, when driving for display, for example, in a data writing stage, the data writing transistor T2 and the switching transistor T3 are turned on according to the scanning signal received by the scanning signal terminal GATE. The data signal Vdata is input from the data signal terminal DATA via the data line, and then written to the first node N1 through the data writing transistor T2, the second node N2, the driving transistor T1, the third node N3, and the switching transistor T3, and thus stored in storage capacitor C1. In this stage, the light-emitting control transistors T5 and T6 are in an off state according to the light-emitting control signals received by the light-emitting control terminals EM1 and EM2 to prevent the light-emitting element D1 from emitting light. In a light-emitting stage, light-emitting control transistor T5 and T6 are turned on, and the first voltage Vdd supplied from the first voltage terminal VDD is applied to the source electrode of the driving transistor T1; the driving transistor T1 drives the light-emitting element D1 to display at a corresponding gray-scale according to the data signal Vdata. Specifically, the driving current flowing from the first voltage terminal VDD to the second voltage terminal VSS and flowing through the driving transistor T1 and the light-emitting element D1 is $I=K*(Vdata-Vdd)^2$, where K is a constant value. It can be seen that, in the case where the first voltage Vdd remains unchanged, the magnitude of the driving current I (i.e., the brightness of the light-emitting element D1) is directly related to the data signal Vdata. Further, the reset transistors T4 and T7 respectively apply a reset voltage from the reset signal terminal VINT to the first node N1 and the fourth node N4 according to the reset control signals received by the reset terminals RST1 and RST2, whereby the pixel driving circuit can be initialized.

As shown in FIG. 1, when crack detection is performed, a crack detection signal (for example, data signal Vdata) may be input from one terminal of the crack detection line 300. After the transmission of the crack detection signal, the crack detection signal reaches the data line DL connected to the crack detection line 300, thereby driving the pixel unit 110 connected to the data line DL to emit light. At the same time, the data line DL (not shown) that is not connected to the crack detection line 300 also receives the same data signal as the crack detection signal, thereby driving the pixel unit 110 connected to this data line DL to emit light. When a crack occurs in a film layer in the peripheral area 200 and causes a crack in the crack detection line 300, the resistance of the crack detection line 300 is increased, so that there is no sufficient data signal Vdata that is written onto the data line DL connected to the crack detection line 300. For example, there is no signal written onto the data line DL or the voltage amplitude of the data signal is decreased, so that the two columns of pixel units 110 connected to the crack detection line 300 may display several bright or dark lines when emitting light as compared with the pixel units of the remaining columns, thereby realizing crack detection.

Figure 3:
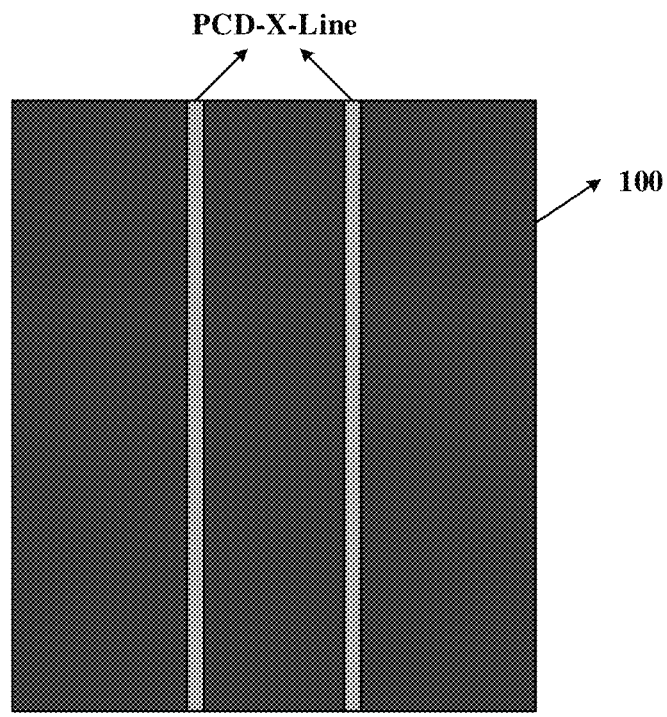
FIG. 3 is a schematic diagram of a crack detection dark line occurring in an electrical detection stage.

However, as display products are continuously updated, the resolution thereof is getting increasingly higher, and the requirements for narrow frames are also getting higher. In a narrow-frame display product, the data lines DL may only use a single-sided switch, and a crack detection line cannot be turned off in the electrical detection stage. In the electrical detection, all the pixel units of the display panel need to be driven to light for detection. Because the crack detection line itself has a voltage drop (IR drop), the pixel units connected to the crack detection line are prone to present crack detect bright lines (or dark lines) (PCD-X-Line) when they are lit at a low gray-scale. As shown in FIG. 3, the crack detection bright line (or dark line) will be regarded as a display defect, resulting in a false detection. In addition, the crack detection test is performed on a plurality of display panels, the results of which are shown in Table 1. In the crack evaluation, the resistance change amount Rs of the crack detection line in the display panel, in which a risk of package leakage have already existed, is on the order of 10 KΩ. However, the differences in currents caused by the resistance change on the order of 10 KΩ is not enough to reflect the difference in brightness that can be recognized by human eyes. For example, as shown in the display panels numbered 3, 4, and 5 in Table 1, although a crack exists, it is not detected. This will cause a missed detection, and will affect the subsequent process stages. For example, as shown in the display panels numbered 6 and 7 in Table 1, when the resistance change amount Rs of the crack detection line reaches the order of 1 MΩ, the crack can be detected normally.

TABLE 1

| Display panel number | Does a crack exist? | Is a crack detected? | Resistance change amount of crack detection line (Rs) |
| --- | --- | --- | --- |
| 1 | No | No | 22.1 KΩ |
| 2 | No | No | 28.2 KΩ |
| 3 | Yes | No | 21.1 KΩ |
| 4 | Yes | No | 27.8 KΩ |
| 5 | Yes | No | 29.8 KΩ |
| 6 | Yes | Yes | 239.3 MΩ |
| 7 | Yes | Yes | 1035 MΩ |

At least one embodiment of the present disclosure provides a display panel, which includes a display area and a peripheral area surrounding the display area. The display area is provided with pixel units arranged in an array, and the pixel unit includes a pixel driving circuit. The peripheral area is provided with a crack detection line, and the crack detection line is connected to a reset signal terminal of the pixel driving circuit of at least one pixel unit.

At least one embodiment of the present disclosure also provides a display device and a detection method corresponding to the above display panel.

The display panel, the display device and the detecting method provided by at least one embodiment of the present disclosure can reduce the influence of the voltage drop over the crack detection line on brightness in an electrical detection stage, and can also improve the detection rate of the cracks in the peripheral area.

Embodiments of the present disclosure and examples thereof will be described in detail below with reference to the accompanying drawings.

Figure 4:
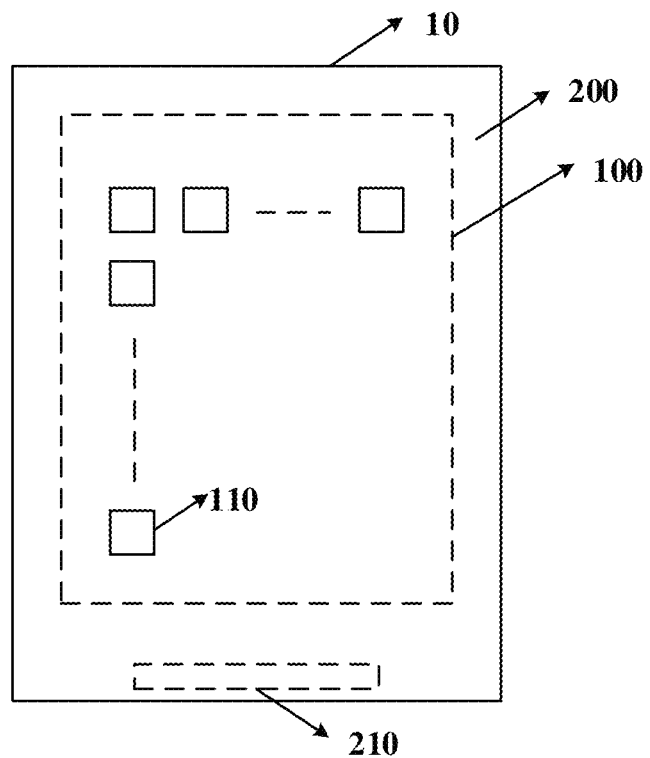
FIG. 4 is a first schematic diagram of a display panel provided by some embodiments of the present disclosure.

At least one embodiment of the present disclosure provides a display panel 10, as shown in FIG. 4, and the display panel 10 includes a display area 100 and a peripheral area 200 surrounding the display area 100. The display area 100 is provided with pixel units 110 arranged in an array. The peripheral area is used for routing various wires, bonding driver chips, and encapsulation of the display panel. It should be noted that, in FIG. 4, only a portion of the pixel unit 110 is schematically illustrated; in the figure, the pixel units are arranged in rows in a horizontal direction and arranged in columns in a vertical direction. For example, a bonding area 210 is also included in the peripheral area 200 located on one side of the display panel 10. The bonding area 210 may be used, for example, for the bonding of the flexible circuit board pads. The following embodiments are the same, the description of which will not be repeated.

Figure 5:
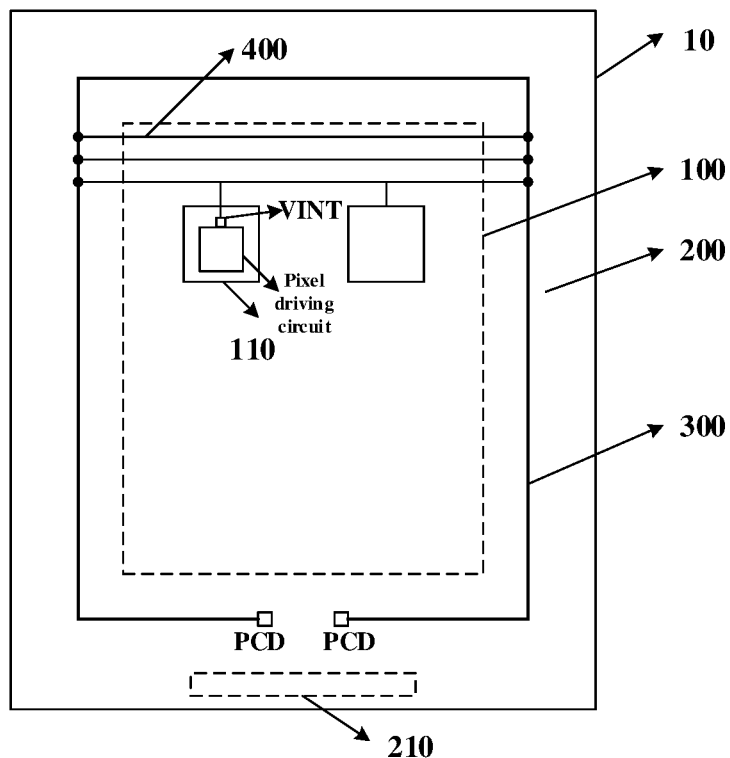
FIG. 5 is a second schematic diagram of a display panel provided by some embodiments of the present disclosure.

For example, as shown in FIG. 5, in the display panel 10, the pixel unit 110 includes a pixel driving circuit (not shown). For example, the pixel driving circuit may adopt the pixel driving circuit shown in FIG. 11 or FIG. 12, and the embodiments of the present disclosure include but are not limited thereto. The pixel driving circuit may also adopt other forms of circuit structures as long as the driving current can be supplied to the light-emitting element D1. For example, a crack detection line 300 is provided in the peripheral area 200, and the crack detection line 300 is connected to at least one reset signal terminal VINT of the pixel driving circuit of the pixel unit 110.

For example, in one example, the crack detection line 300 may be connected to the pixel unit 110 via a first reset signal line 400. In the display panel 10 provided by some embodiments of the present disclosure, for example, a reset signal line may be provided corresponding to each row of the pixel units 110, and the reset signal line is connected to the reset signal terminal VINT of the pixel driving circuits in the row of pixel units 110. In the description below, the reset signal line connected to the crack detection line 300 is referred to as a first reset signal line 400, and other reset signal lines except the first reset signal line 400 are referred to as second reset signal lines 500. The following embodiments are the same, the description of which will not be repeated.

For example, in the display panel 10 shown in FIG. 5, a crack detection terminal PCD may be provided on the end of the crack detection line 300 closer to the bonding area 210. The crack detection signal can be applied to the crack detection line 300 by the crack detection terminal PCD. For example, the first reset signal line 400 may be provided on the side of the display panel 10 away from the crack detection terminal PCD, so that the crack detection signal may pass through more areas in the peripheral area 200 before reaching the pixel units 110 through the crack detection line 300, thereby enabling the crack detection line 300 to detect more cracks existing in the peripheral area 200.

In the display panel 10 provided by some embodiments of the present disclosure, through providing the crack detection line 300 in the peripheral area 200 of the display panel 10, and connecting the crack detection line 300 to the reset signal terminal VINT of the pixel driving circuit of a pixel unit 110, the crack detection signal can be applied to one terminal of the light-emitting element D1 (shown by a dotted line with an arrow in FIG. 11) through the reset signal terminal VINT of the pixel driving circuit, so that the light-emitting element D1 can be driven.

In the above manner, for example, in the electrical detection stage, the crack detection signal applied to the reset signal terminal VINT may be a reset signal Vint. The reset signal Vint initializes the pixel driving circuit in the reset stage only. It can be seen from above that the magnitude of the ultimate driving current I of the light-emitting element D1 is related to the data signal Vdata. Therefore, in the electrical detection stage, the influence on the brightness of the light-emitting element D1 caused by the voltage drop over the crack detection line 300 can be avoided, thereby reducing the false detection rate resulted by the crack detection line 300. In addition, in the above manner, for example, when crack detection is performed, the crack detection signal applied to the reset signal terminal VINT can directly drive the light-emitting element D1 (for example, the drive transistor T1 is kept turned off at this time) to emit light. At the time of crack evaluation, the resistance change amount Rs of the crack detection line in the display panel where there is a risk of package leakage is on the order of 10 KΩ. This resistance change amount Rs on the order of 10 KΩ can produce a significant change to the driving current I flowing through the light-emitting element D1 as compared with a normal situation. The change can thereby indicate whether or not the crack detection line 300 has suffered from a crack. In other words, the detection rate of the crack in the peripheral area can be improved.

It should be noted that, in some embodiments of the present disclosure, crack detection may be performed in an electrical detection stage. For example, crack detection may be performed after other types of detection are completed, or may be interspersed in other types of detection. The embodiments of the present disclosure are not limited thereto.

Figure 11:
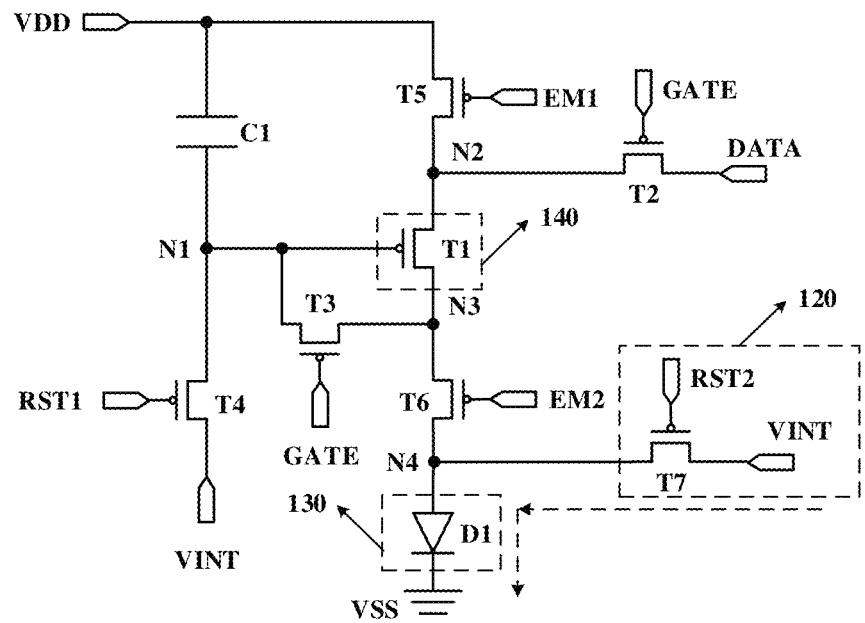
FIG. 11 is a schematic diagram of a pixel driving circuit at the time of crack detection.
Figure 12:
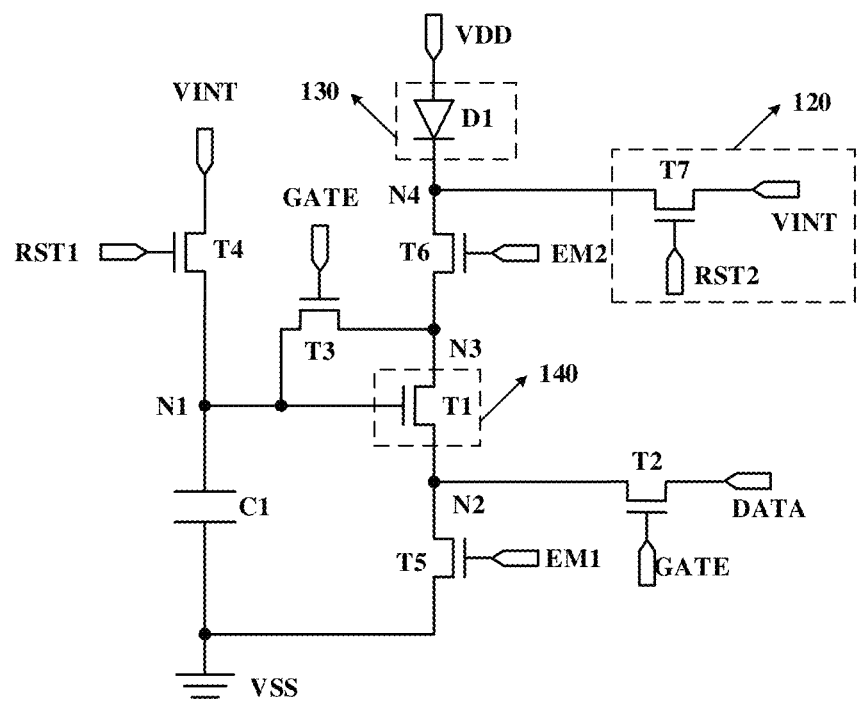
FIG. 12 is a schematic diagram of another pixel driving circuit.

For example, in the display panel 10 provided by some embodiments of the present disclosure, the pixel driving circuit may adopt the pixel driving circuit shown in FIG. 11 or FIG. 12. For example, the pixel driving circuit includes a reset circuit 120 having a reset signal terminal VINT and includes a light-emitting circuit 130 connected to the reset circuit 120. The reset circuit 120 is configured to receive from the crack detection line 300 a crack detection signal to cause the light-emitting circuit 130 to emit light. For example, when the crack detection is performed, the driving circuit 140 is controlled to turn off and the reset circuit 120 is controlled to turn on, so that the crack detection signal applied to the reset signal terminal VINT can directly drive the light-emitting circuit 130 to emit light. Therefore, based on the brightness of the light-emitting circuit 130, it is possible to determine whether or not the crack detection line 300 has a defect such as a crack, or to determine whether or not there is a defect such as a crack in the peripheral area 200 of the display panel 10.

For example, as shown in FIG. 11 and FIG. 12, the reset circuit 120 may be implemented as a seventh transistor T7 and a reset signal terminal VINT connected to one electrode of the seventh transistor T7. The light-emitting circuit 130 may be implemented as the light-emitting element D1. It should be noted that, the light-emitting element D1 may adopt an organic light-emitting diode (OLED) or a quantum dot light-emitting diode (QLED). The OLED may be of various kinds (bottom emission, top emission, etc.), and may emit red light, green light or blue light etc. according to needs. Embodiments of the present disclosure include, but are not limited to, the above cases.

For example, as shown in FIGS. 11 and 12, the pixel driving circuit further includes a driving circuit 140 configured to control the driving current I for driving the light-emitting circuit 130 to emit light. For example, when performing electrical detection, the driving circuit 140 is turned on, and the driving circuit 140 can drive the light-emitting circuit 130 according to the magnitude of the data signal Vdata, e.g., performing lighting tests at a low gray scale and at a high gray scale, respectively; and when performing crack detection, the driving circuit 140 is turned off so that there is no driving current from the driving circuit 140, and accordingly the crack detection signal can drive the light-emitting circuit 130 to emit light directly through the reset circuit 120. For example, as shown in FIG. 11 and FIG. 12, the driving circuit 140 may be implemented as the first transistor T1.

For example, the pixel driving circuit as shown in FIG. 11 and FIG. 12, may further include a second transistor T2, a third transistor T3, a fourth transistor T4, a fifth transistor T5, a sixth transistor T6, and a storage capacitor C1. A gate electrode of the second transistor T2 is connected to a scan signal terminal GATE to receive a gate scan signal. A gate electrode of the third transistor T3 is connected to the gate scan signal terminal GATE to receive the gate scan signal. A gate electrode of the fourth transistor T4 is connected to a first reset terminal RST1 to receive a first reset control signal. A gate electrode of the fifth transistor T5 is connected to a first light-emitting control terminal EM1 to receive a first light-emitting control signal. A gate electrode of the sixth transistor T6 is connected to a second light-emitting control terminal EM2 to receive a second light-emitting control signal. The storage capacitor C1 is configured to store the data signal Vdata and the threshold voltage Vth of the first transistor T1. It should be noted that a first node N1, a second node N2, a third node N3, and a fourth node N4 shown in FIG. 11 and FIG. 12 do not represent actual components, but represent the joint points of related electrical connections in the circuit diagram.

For example, in an initialization stage, the first reset terminal RST1 receives the first reset control signal, and controls to turn on the fourth transistor T4, so that the first node N1, i.e., the gate electrode of the first transistor T1, can be initialized. In a data writing stage, the scan signal terminal GATE receives the gate scan signal, and controls to turn on the second transistor T2 and the third transistor T3, so that the data signal Vdata can be written to the first node N1 through the second transistor T2, the first transistor T1, and the third transistor T3. Moreover, the data signal Vdata can be stored in the storage capacitor C1. In a reset stage, the second reset terminal RST2 receives the second reset control signal, and controls to turn on the seventh transistor T7, so that the fourth node N4 (i.e., the anode terminal or the cathode terminal of the light-emitting element D1) may be reset. In a light-emitting stage, the first light-emitting control terminal EM1 receives the first light-emitting control signal to control to turn on the fifth transistor T5, and the second light-emitting control terminal EM2 receives the second light-emitting control signal to control to turn on the sixth transistor T6, thereby driving the light-emitting element D1 to emit light.

In addition, the pixel driving circuit shown in FIG. 11 adopts P-type transistors for all the transistors; the light-emitting element D1 is located between the current output terminal of the driving transistor T1 and the second voltage terminal VSS (e.g., the low-voltage terminal); the reset circuit 120 is connected to the anode terminal of the light-emitting element D1. The pixel driving circuit shown in FIG. 12 adopts N-type transistors for all the transistors; the light-emitting element D1 is located between the current input terminal of the driving transistor T1 and the first voltage terminal VDD (e.g., the high voltage terminal); the reset circuit 120 is connected to the cathode terminal of the light-emitting element D1.

The pixel units of the display panels of the embodiments of the present disclosure include but are not limited to the pixel driving circuits shown in FIG. 11 and FIG. 12, for example, the pixel driving circuits may also adopt a P-type transistor(s) and an N-type transistor(s) in mixture. The pixel driving circuits may include a compensation circuit or may not include a compensation circuit or the like, and include a reset circuit having a reset signal terminal and includes a light-emitting circuit connected to the reset circuit. The reset circuit is electrically connected to one terminal of the light-emitting circuit, and the other terminal of the light-emitting circuit is connected to the voltage terminal. Accordingly, the reset circuit can for example receive the crack detection signal from the crack detection line to render the light-emitting circuit to emit light, so that crack detection can be performed.

In the display panel 10 provided by the embodiments of the present disclosure, the crack detection line 300 is at least partially disposed around the display area 100. For example, the crack detection line 300 is substantially disposed to fully surround the display area 100.

Figure 6:
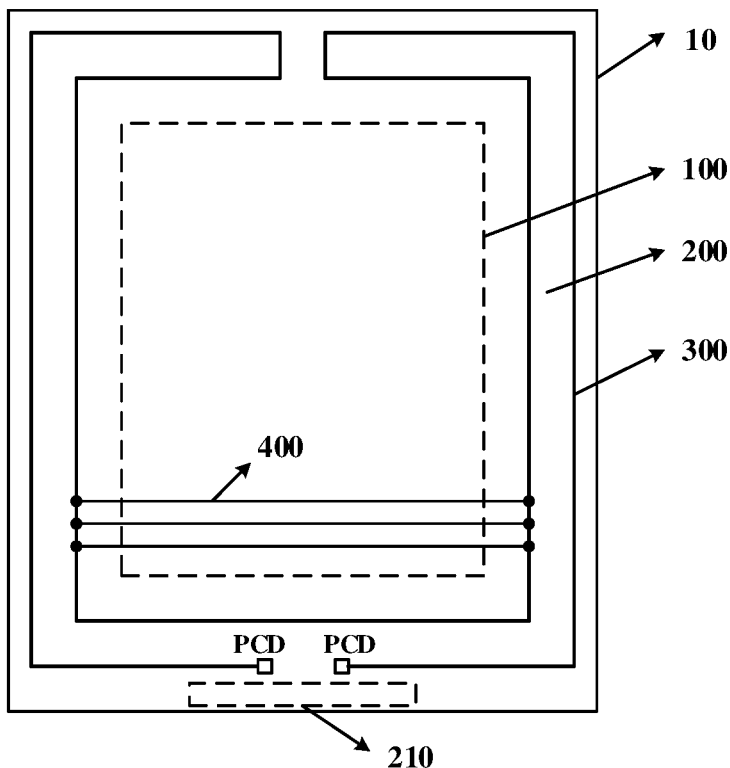
FIG. 6 is a schematic diagram of another display panel provided by some embodiments of the present disclosure.

For example, in one example, as shown in FIG. 6, one crack detection line 300 may be disposed in the peripheral area 200 of the display panel 10, and the crack detection line 300 winds around twice on the left and right sides of the display area 100. For example, a crack detection terminal PCD is provided on the side of the crack detection line 300 closer to the bonding area 210, and the crack detection signal may be applied by the crack detection terminal PCD. For example, in the example shown in FIG. 6, the first reset signal line 400 may be provided on the side of the display panel 10 near the crack detection terminal PCD, so that the crack detection signal may pass through more areas in the peripheral areas 200 before reaching the pixel units 110 through the crack detection line 300. Accordingly, the crack detection line 300 can detect more cracks that may exist in peripheral area 200, thereby improving the detection rate of cracks in the peripheral area.

Figure 7:
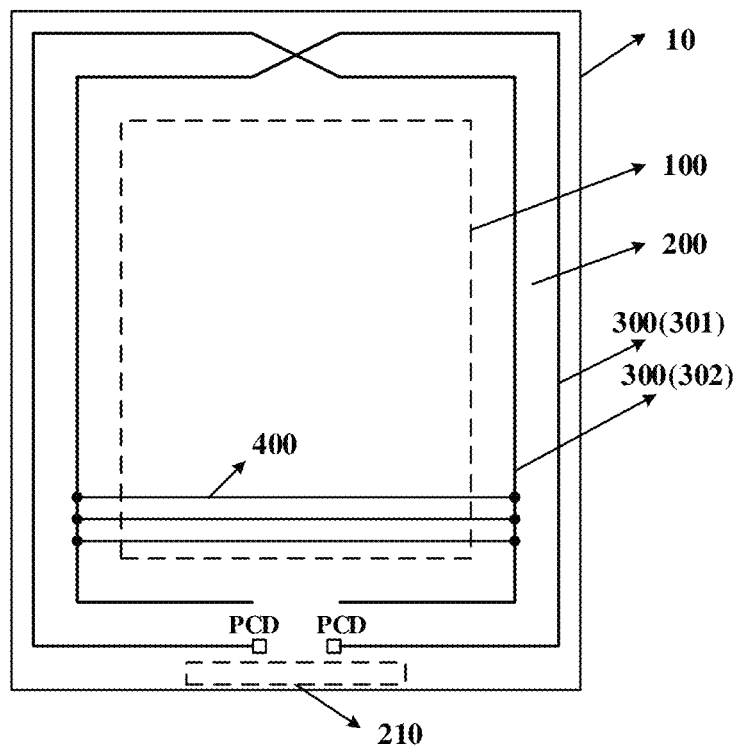
FIG. 7 is a schematic diagram of still another display panel provided by some embodiments of the present disclosure.

For example, in another example, as shown in FIG. 7, two crack detection lines 300 may be disposed in the peripheral area 200 of the display panel 10. The two crack detection lines 300 are intersecting but insulating from each other on one side of the display panel 10, so that each crack detection line 300 can circle the display panel 10. Similarly, in the example shown in FIG. 7, the first reset signal line 400 may be placed on the side of the display panel 10 closer to the crack detection terminal PCD, so that the crack detection signal may pass through more areas in the peripheral area 200 before reaching the pixel unit 110 through the crack detection line 300. Accordingly, the crack detection line 300 can detect more cracks that may exist in peripheral area 200, thereby improving the detection rate of cracks in the peripheral area.

Figure 8:
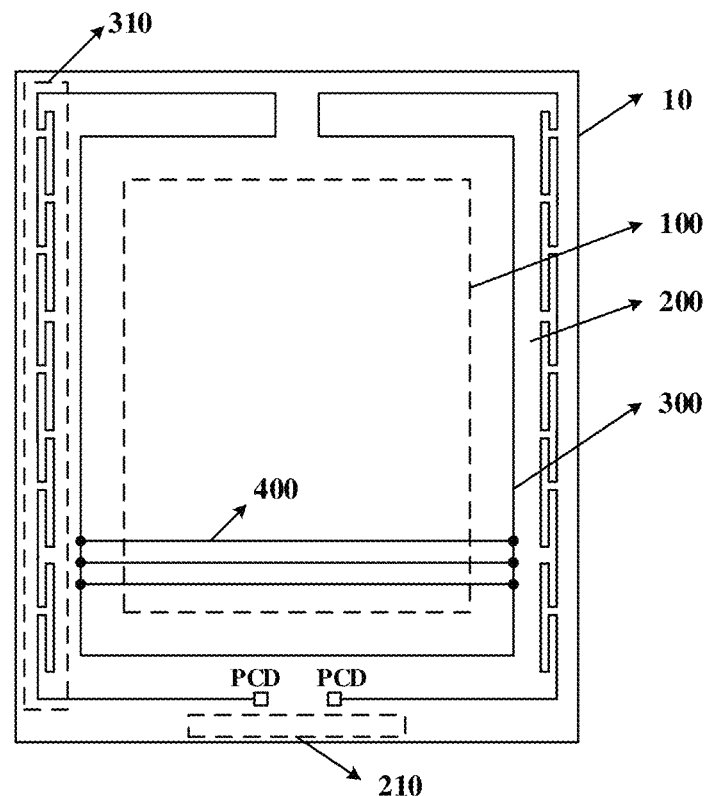
FIG. 8 is a schematic diagram of still another display panel provided by some embodiments of the present disclosure.

For example, as shown in FIG. 8, in the display panel 10 provided by the embodiment of the present disclosure, the crack detection line 300 may further include a snake-shaped line portion 310. For example, the snake-shaped line portion 310 may be S-shaped, Zigzag-shaped or square-wave-shaped. For example, in the example shown in FIG. 8, a snake-shaped line portion 310 is included in each of the left and right sides of the crack detection line 300, and embodiments of the present disclosure include but are not limited thereto. For example, more snake-shaped line portions 310 may be included in the crack detection line 300, which is not limited in the present disclosure.

In the display panel 10 provided by some embodiments of the present disclosure, by providing the snake-shaped line portion 310, the crack detection line 300 is disposed to pass through more areas in the peripheral area 200. Accordingly, the crack detection line 300 may detect more cracks that may exist in peripheral areas 200, thereby improving the detection rate of cracks in the peripheral area.

Figure 9:
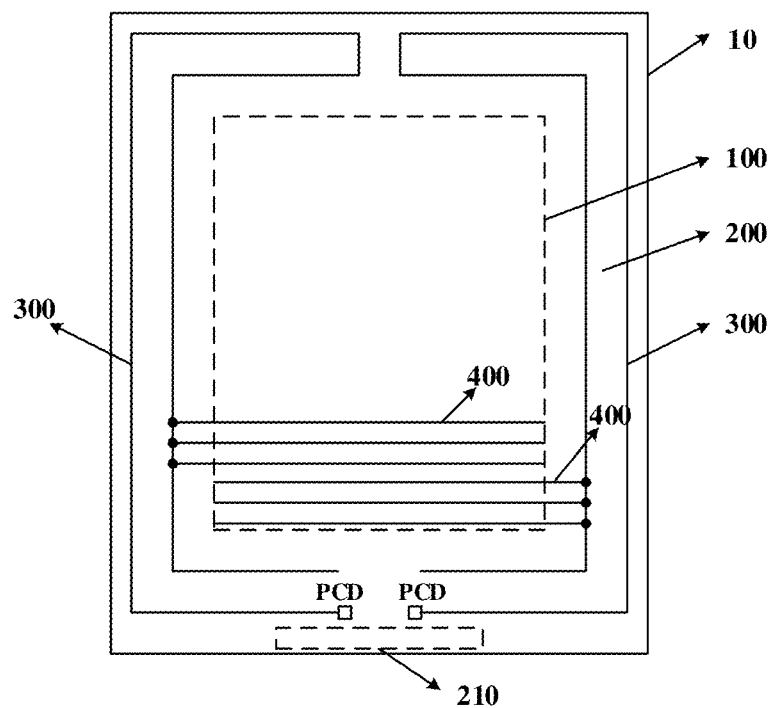
FIG. 9 is a schematic diagram of still another display panel provided by some embodiments of the present disclosure.

For example, in the display panel 10 provided by some embodiments of the present disclosure, a plurality of crack detection lines 300 are disposed in different regions in the peripheral area 200, and the plurality of crack detection lines 300 are respectively connected to reset signal terminals VINT of the pixel driving circuits of different pixel units 110. For example, in the example shown in FIG. 9, crack detection lines 300 are disposed on each of the left and right sides of the peripheral area 200. The two crack detection lines 300 are respectively connected to the reset signal terminal VINT of the pixel driving circuits of different pixel units. For example, the two crack detection lines 300 are respectively connected to the reset signal terminal VINT of the pixel driving circuits of the pixel units of different rows. That is, the two crack detection lines 300 are respectively connected to different first reset signal lines 400. For example, when there is a crack in the crack detection line 300 on the left side, the pixel units connected to the crack detection line 300 on the left side will appear as a dark line (as will be described below) at the time of crack detection is performed as compared with other pixel units connected to the second reset signal lines 500; likewise, when there is a crack in the crack detection line 300 on the right side, the pixel unit connected to the crack detection line 300 on the right side will appear as a dark line at the time of crack detection is performed as compared with other pixel units connected to the second reset signal lines 500, thereby realizing the sub-area crack detection.

In the display panel 10 provided by some embodiments of the present disclosure, by providing a plurality of crack detection lines 300 in different regions in the peripheral area 200, the plurality of crack detection lines 300 may be used for respectively detecting whether cracks exist in different regions in the peripheral area 200, so that the areas where the cracks exist can be located more quickly.

In the display panel 10 provided by some embodiments of the present disclosure, the reset signal terminals VINT of the pixel driving circuits of the pixel units 110 in at least one row is all connected to the first reset signal line 400. The first reset signal line 400 is directly connected to the crack detection line 300, and the crack detection signal is applied to the first reset signal line 400 by the crack detection line 300, so that the voltage of the first reset signal line 400 is affected by the crack detection line 300. For example, in the example shown in FIG. 10, three first reset signal lines 400 are provided, and each reset signal line 400 is connected to the reset signal terminals VINT of the pixel driving circuits of the pixel units 110 in the row (the pixel units 110 are not shown in FIG. 10 for clarity). For example, the three first reset signal lines 400 may be adjacently disposed. That is, the three first reset signal lines 400 are respectively connected to the pixel units 110 of the adjacent rows, e.g., connected to the green sub-pixel unit in the pixel units 110 of the adjacent rows. The embodiments of the present disclosure include but are not limited thereto. For example, the three first reset signal lines 400 may also connect to sub-pixel units of another color, such as red sub-pixel units or blue sub-pixel units, in the pixel units 110 of the adjacent rows.

In the display panel 10 provided by some embodiments of the present disclosure, the first reset signal line 400 is connected to the pixel units 110 in at least one row. The first reset signal line 400 is connected to the crack detection line 300 in such a manner that when a crack occurs in the crack detection line 300, the pixel units 110 connected to the crack detection line 300 may form a dark line when emitting light, so that it may be directly detected if there's a crack in the display panel 10 by observation. In addition, a plurality of first reset signal lines 400 that are respectively connected to the pixel units 110 of adjacent rows are provided in such a manner that when a crack occurs in the crack detection line 300, the pixel units 110 of the adjacent rows connected to crack detection lines 300 can form a plurality of adjacent dark lines when emitting light, thereby improving efficiency when observing whether there is a dark line in the display panel during display.

In the display panel 10 provided by some embodiments of the present disclosure, e.g., in the examples shown in FIGS. 6, 7, 8, 9, and 10, the first reset signal line 400 is connected to the portion of the crack detection line 300 that are closer to the display area 100. For example, the first reset signal line 400 is connected to the portion closest to the display area 100. For example, in the display panel 10 shown in FIG. 10, the crack detection line 300 winds around twice on the left and right sides of the display area 100. So, the crack detection line 300 includes a first portion (301) on the outer side away from the display area and a second portion 302 on the inner side of the display area 100 (see FIG. 7). The first portion 301 and the second portion 302 are parallel to each other, and the first reset signal line 400 is connected to the second portion of the crack detection line 300 that are adjacent to the display area 100. Because formation of a hole is needed to connect the first reset signal line 400 and the crack detection line 300, the first portion of the crack detection line 300 away from the display area 100 is closer to the edge of the display panel 10, and if the first reset signal line 400 is connected to the first portion of the crack detection line 300 away from the display area 100, cracks may easily occur at the connecting position, which may affect the yield of the display panel 10. Therefore, the connection between the first reset signal line 400 and the second portion of the crack detection line 300 closer to the display area 100 can improve the quality of the connection between the two and can thereby improve the detection accuracy.

Figure 10:
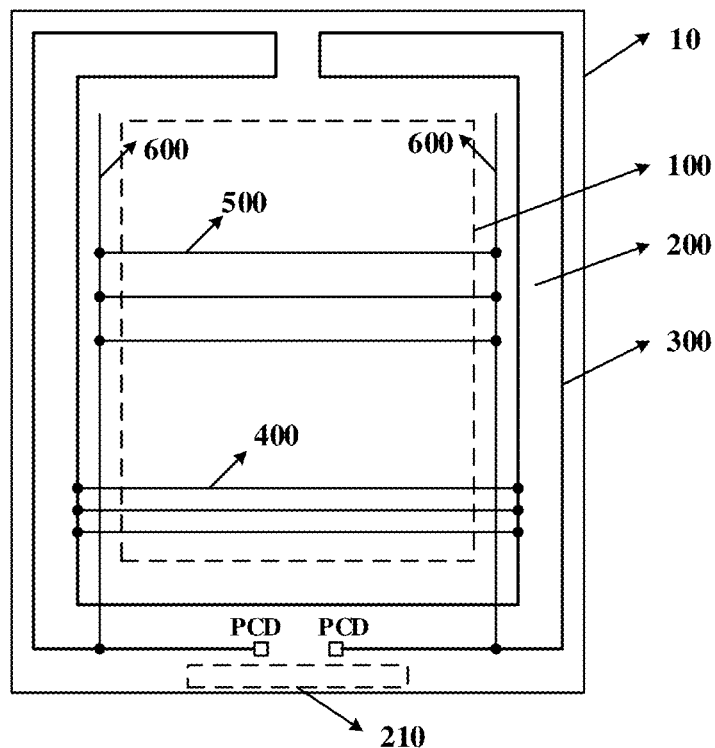
FIG. 10 is a schematic diagram of still another display panel provided by some embodiments of the present disclosure.

In the display panel 10 provided by some embodiments of the present disclosure, as shown in FIG. 10, except the at least one row of pixel units electrically connected to the crack detection line 300, each row of pixel units is correspondingly provided with a second reset signal line 500. The second reset signal line 500 receives a reset signal Vint, and the second reset signal line 500 is connected to the reset signal terminal VINT of the pixel driving circuits of the row of pixel units 110 for resetting the light-emitting element in the pixel driving circuits during the display operation. The second reset signal line 500 applies the same voltage signal as the crack detection signal to the reset signal terminals of the pixel driving circuits connected to the second reset signal line 500 when performing crack detection, thereby driving the light-emitting elements in the pixel driving circuits to emit light.

In the display panel 10 provided by some embodiments of the present disclosure, as shown in FIG. 10, a reset common line 600 may also be included. The reset common line 600 is connected to the second reset signal lines 500, and the reset common line 600 is connected to the crack detection terminal PCD. In this manner, when a crack detection signal is applied to the crack detection line 300 through the crack detection terminal PCD, the crack detection signal can also be transmitted to the pixel units 110 connected to the second reset signal lines 500 through the reset common line 600 and the second reset signal lines 500.

For example, as shown in FIG. 10, the crack detection line 300 includes a crack detection terminal PCD disposed in the peripheral area 200 on one side of the bonding area 210. The crack detection terminal PCD is configured to receive the crack detection signal. The first reset signal line 400 is closer to the crack detection terminal PCD relative to the second reset signal line 500. The crack detection signal may be applied, for example, by a probe contacting the crack detection terminal PCD. In this manner, the crack detection signal may pass through more areas in the peripheral areas 200 before reaching the pixel unit 110 through the crack detection line 300, so that the crack detection line 300 can detect more cracks that may exist in peripheral area 200. Accordingly, the detection rate of cracks in the peripheral area can be improved.

In another example, the reset common line 600 is connected to the second reset signal line 500. However, the reset common line 600 is not connected to the crack detection terminal PCD, but connected to a separately provided common voltage signal terminal (not shown). When crack detection is performed, the same signal as the crack detection signal applied to the crack detection terminal PCD is applied to the common voltage signal terminal.

In the display panel 10 provided by some embodiments of the present disclosure, the crack detection line 300 is disposed in a certain metal layer in the circuit structure layer of the display panel. For example, the crack detection line 300 is disposed in a gate metal layer (i.e., the metal pattern layer where the gate electrode is located) or the source-drain metal layer (i.e., the metal pattern layer where the source electrode and the drain electrode are located) etc. of the driving transistor in the pixel driving circuit. That is, the crack detection line 300 is formed by the same metal film and the same patterning process as the gate electrode or the source/drain electrode of the driving transistor. For example, the material of the crack detection line 300 may be metal, such as metal Molybdenum (Mo) or Mo alloy, metal Aluminum or Aluminum alloy. Embodiments of the present disclosure are not limited to the case that the crack detection line is formed in the above layers or formed using the above materials.

The working operation of crack detection will be described below by taking the display panel 10 shown in FIG. 10 and the pixel driving circuit shown in FIG. 11 as an example.

In the electrical detection stage, all the pixel units 110 in the display panel 10 need to be driven to emit light for testing. For example, lighting tests are performed under the drive of data signal Vdata at a low gray-scale and a high gray-scale, respectively. For example, in the reset stage, a reset signal Vint is applied by the crack detection terminal PCD. The reset signal Vint is transmitted to the first reset signal line 400 and the second reset signal line 500 through the crack detection line 300 and the reset common line 600, respectively, and then is transmitted to the pixel units 110 of the corresponding rows through the first reset signal line 400 and the second reset signal line 500. In the pixel driving circuit in each pixel unit 110, for example, as shown in FIG. 11, the reset signal Vint is applied to the pixel driving circuit through the reset signal terminal VINT, thereby completing the corresponding reset operation. For example, in the data writing stage, the data signal Vdata is input from the data signal terminal DATA, and is written into the first node N1 through the second transistor T2, the driving transistor T1, and the switching transistor T3, and the data signal Vdata is stored in the storage capacitor C1. In the light-emitting stage, the first voltage Vdd supplied from the first voltage terminal VDD is applied to the source electrode of the driving transistor T1. The driving transistor T1 drives the light-emitting element D1 to display the corresponding gray-scale according to the data signal Vdata. Specifically, the driving current flowing from the first voltage terminal VDD to the second voltage terminal VSS through the driving transistor T1 and the light-emitting element D1 is $I=K*(Vdata-Vdd)^2$, where K is a constant value. In the case where the first voltage Vdd remains unchanged, the magnitude of the driving current I is directly related to the data signal Vdata.

Figure 14:
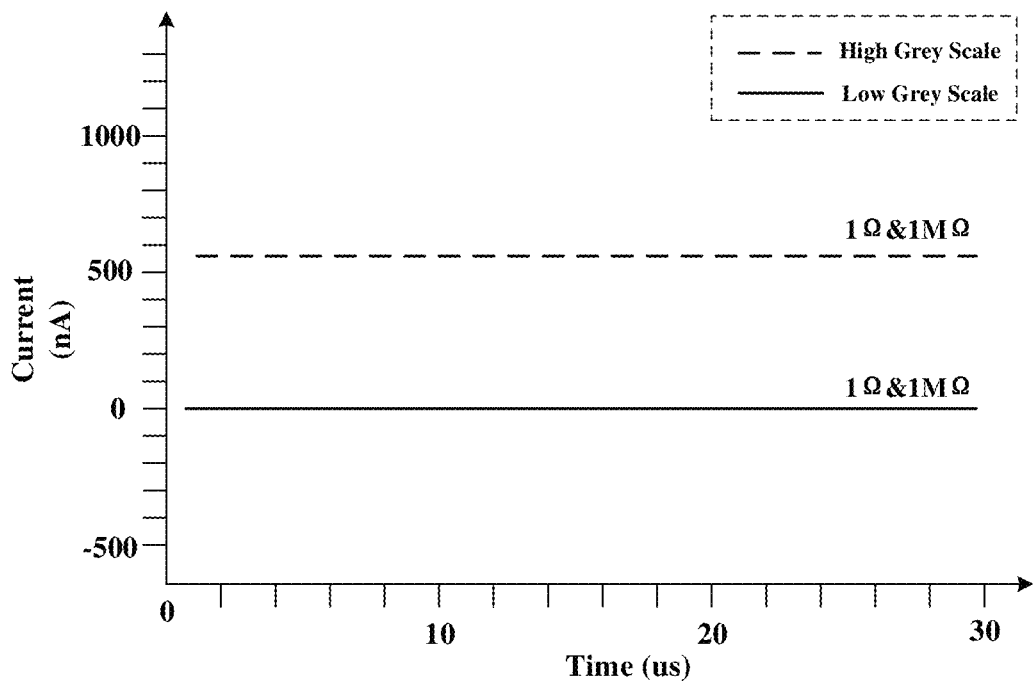
FIG. 14 is a first schematic diagram showing the simulation result of crack detection of a display panel provided by some embodiments of the present disclosure.

Because in the electrical detection stage, the reset signal Vint initializes the pixel driving circuit only in the reset stage, and as can be seen from the above, the magnitude of the ultimate driving current I of the light-emitting element D1 is related to the data signal Vdata, the influence by the voltage drop over the crack detection line 300 upon the brightness of the light-emitting element D1 can be avoided in the electrical detection stage. Therefore, the false detection rate due to the crack detection line can be reduced. For example, in the diagram showing the simulation result in FIG. 14, the horizontal axis represents time, the vertical axis represents the driving current I flowing through the light-emitting element D1. The solid line in the figure represents the driving current I when the resistance change amount Rs of the detection line 300 is 1Ω and 1 MΩ under the driving of the low-gray data signal Vdata; and the dotted line in the figure represents the driving current I when the resistance change amount Rs of the detection line 300 is 1Ω and 1 MΩ under the driving of the high-gray data signal Vdata. As can be seen from FIG. 14, regardless of whether driven by the low-gray or high-gray data signal Vdata, even if the crack detecting line 300 has undergone a resistance change amount Rs of 1 MΩ due to a voltage drop or a crack, the variation of the driving current I flowing through the light-emitting element D1 is smaller than 1 nA. That is, the brightness of the light-emitting element D1 is hardly affected, so that the false detection rate due to the crack detection line can be reduced.

Figure 15:
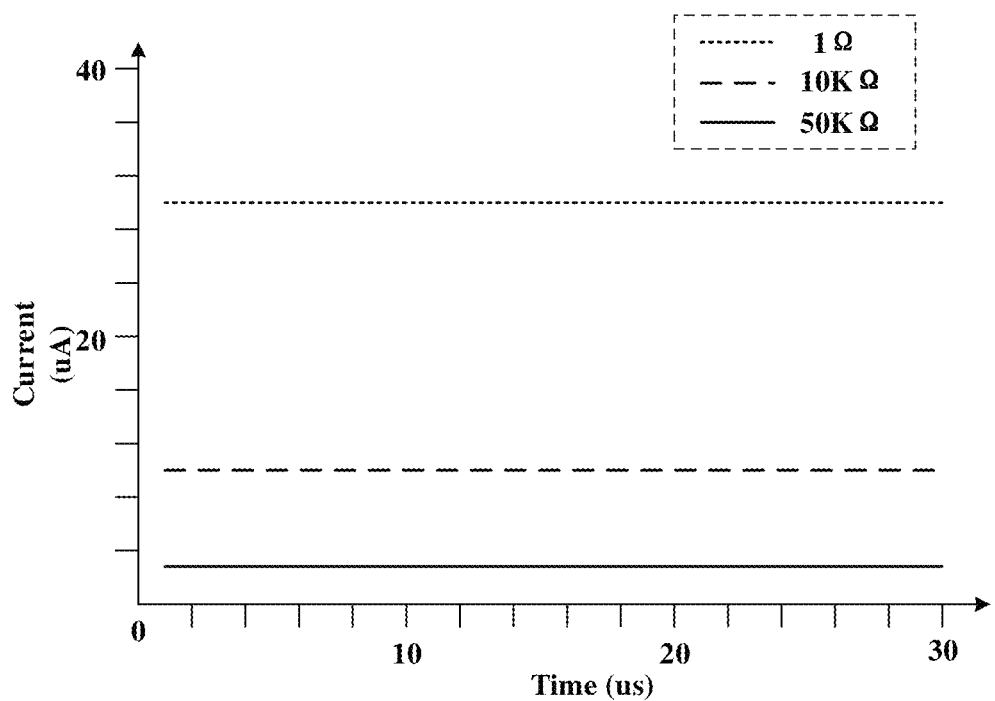
FIG. 15 is a second schematic diagram showing the simulation result of crack detection of a display panel provided by some embodiments of the present disclosure.

When the crack detection is performed, the crack detection signal is applied by the crack detection terminal PCD, and the crack detection signal is transmitted to the first reset signal line 400 and the second reset signal line 500 through the crack detection line 300 and the reset common line 600, respectively. Then the crack detection signal is transmitted to the pixel units 110 of the corresponding rows through the first reset signal line 400 and the second reset signal line 500. In the pixel driving circuit in each pixel unit 110, for example, as shown in FIG. 11, the driving circuit 140 is turned off, and the reset circuit 120 is turned on. In this embodiment, the crack detection signal is a high-level signal (higher than the second voltage terminal VSS), establishing a forward voltage difference across both terminals of the light-emitting circuit 130, so that the crack detection signal applied to the reset signal terminal VINT can directly drive the light-emitting circuit 130 to emit light. Accordingly, it is possible to determine whether there is a crack in the crack detection line 300, i.e., whether there is a crack in the peripheral area 200 of the display panel 10, based on the brightness of the light-emitting circuit 130. For example, the high-level signal may be selected to be a voltage signal that can allow the light-emitting element D1 to emit light having a gray-scale of 127 (the gray-scale range is 0 to 255). For example, in the diagram showing the simulation result in FIG. 15, the horizontal axis represents time, the vertical axis represents the driving current I flowing through the light-emitting element D1. FIG. 15 shows the driving current I when the resistance change amount Rs of the crack detection line 300 is 1Ω, 10 KΩ and 50 KΩ respectively. As can be seen from FIG. 15, when the resistance change amount Rs of the crack detection line 300 changes from 1Ω to 10 KΩ or changes from 1Ω to 50 KΩ, the driving current I changes significantly. The magnitude of the current change is on the order of 1 μA. The change of the driving current I can result in a significant change in the brightness of the light-emitting element D1, so that the pixel unit row connected to the first reset signal line 400 can for example appear to be a dark line compared to the pixel unit rows connected to the second reset signal lines 500, thereby completing the crack detection.

For example, in one example, when crack detection is performed, the electric potential of the crack detection signal applied to the reset signal terminal VINT is 4.5V; and the electric potentials applied to the scan signal terminal GATE, the first reset terminal RST1, the second reset terminal RST2, the first light-emitting control terminal EM1 and the second light-emitting control terminal EM2 are all −7V; and the electric potentials applied to the first voltage terminal VDD, the second voltage terminal VSS, and the data signal terminal DATA are all 0V. The reset circuit 120 is turned on because the electric potential applied to the second reset terminal RST2 is −7V; and the fourth transistor T4 is turned on because the electric potential applied to the first reset terminal RST1 is −7V. Furthermore, the crack detection signal is applied through the reset signal terminal VINT, so the electric potential of the first node N1 is 4.5V, and the first transistor T1, i.e., the driving circuit 140, is turned off.

For example, in another example, in the pixel driving circuit shown in FIG. 12, when crack detection is performed, the crack detection signal is a low-level signal (lower than the first voltage terminal VDD), the electric potential of the crack detection signal applied to the reset signal terminal VINT is 0V; the electric potentials applied to the scan signal terminal GATE, the first reset terminal RST1, the second reset terminal RST2, the light-emitting control terminal EM1, and the light-emitting control terminal EM2 are all 7V; and the electric potential applied to the first voltage terminal VDD is 4.5V; and the electric potentials applied to the second voltage terminal VSS and the data signal terminal DATA are both −4V, whereby a forward voltage difference is established across both terminals of the light-emitting element D1, so that the light-emitting element D1 can emit light.

Figure 13:
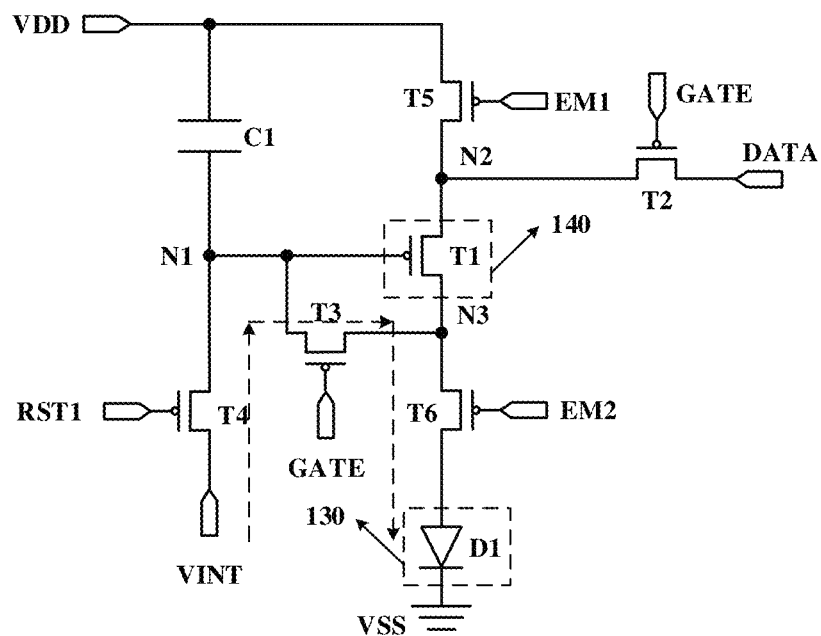
FIG. 13 is a schematic diagram of still another pixel driving circuit.

For example, in another example, as shown in FIG. 13, in the case where the pixel driving circuit does not include the seventh transistor T7, when crack detection is performed, the fourth transistor T4, the third transistor T3, and the sixth transistor T6 may also be turned on, so that the crack detection signal may be applied to the light-emitting element D1 through the conductive path shown by the dotted line with an arrow in FIG. 13, thereby completing the crack detection.

It should be noted that the electric potential of the applied signal described above is only schematic, and the embodiments of the present disclosure include but are not limited thereto, as long as the reset circuit 120 in the pixel driving circuit can be turned on and the driving circuit 140 can be turned off.

Figure 16:
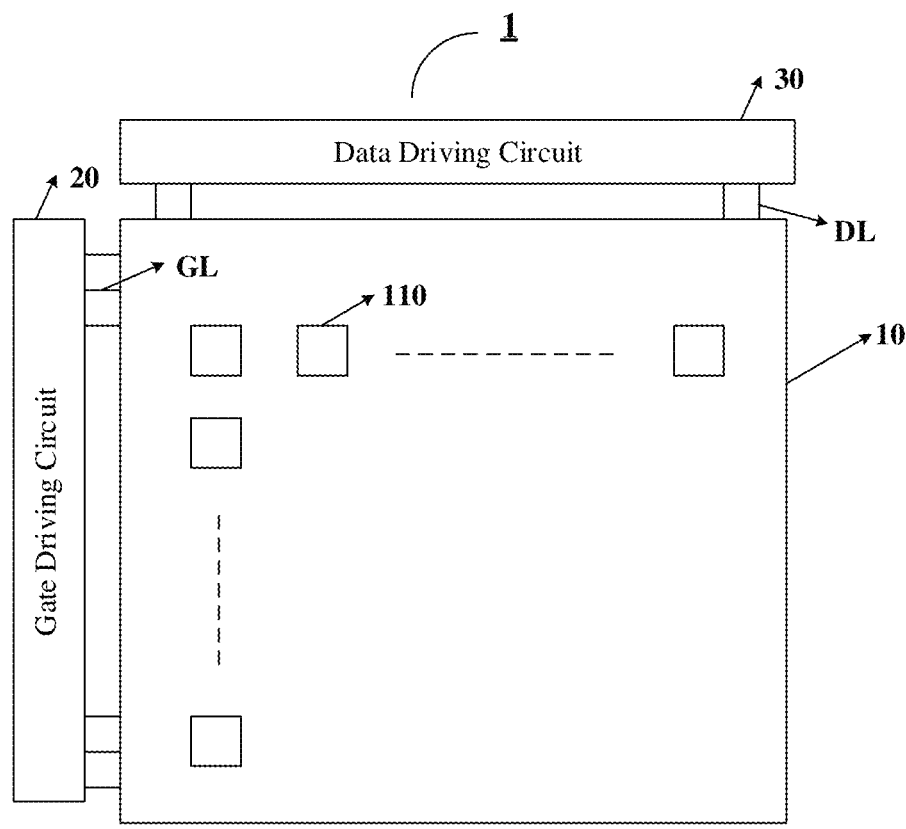
FIG. 16 is a schematic diagram of a display device provided by some embodiments of the present disclosure.

Some embodiments of the present disclosure also provide a display device 1. As shown in FIG. 16, the display device 1 includes a display panel 10 provided by any embodiment of the present disclosure. The pixel units 110 arranged in an array are disposed in the display area of the display panel 10.

For example, as shown in FIG. 16, the display device 1 further includes a gate driving circuit 20 electrically connected to the pixel units 110 through gate lines GL for providing gate scan signals to the pixel array. For example, the display device 1 further includes a data driving circuit 30 electrically connected to the pixel units 110 through the data lines DL for providing data signals to the pixel array.

It should be noted that the display device 1 provided by some embodiments of the present disclosure may be any product or component having a display function, such as a display, an OLED panel, an OLED TV, a mobile phone, a tablet, a notebook computer, a digital photo frame, a navigator, and the like.

For the technical effects of the display device 1 provided by some embodiments of the present disclosure, reference may be made to the corresponding description of the display panel 10 in the above embodiments, and details are not repeated herein.

Some embodiments of the present disclosure also provide a detection method that may be used for a display panel 10 provided by the embodiment of the present disclosure and a display device 1 including the display panel 10. For example, the detection method includes the following operations.

Step S100: providing a crack detection signal to a reset signal terminal VINT of a pixel driving circuit connected to a crack detection line in a pixel unit 110 through a crack detection line; and Step S200: observing whether there is a dark line in the display panel 10 during display.

For example, taking the display panel 10 shown in FIG. 10 as an example, in step S100, the crack detection signal may be provided by the crack detection line 300. For example, the crack detection line 300 may connect to the reset signal terminal VINT of the pixel driving circuit connected to the crack detection line in the pixel unit 110 through the first reset signal line 400.

For example, in the case where the display panel 10 includes the first reset signal line 400, the above detection method further includes the following operations.

Step S300: providing a crack detection signal to a reset signal terminal VINT of the pixel unit 110 not connected to the first reset signal line 400.

For example, taking the display panel 10 shown in FIG. 10 as an example, the operation of step S300 is to provide the crack detection signal to the reset signal terminals VINT of the pixel units 110 connected to the second reset signal line 500. For example, the second reset signal line 500 is connected to a reset common line 600 so that the crack detection signal may be provided by the reset common line 600.

For example, in the case where the pixel driving circuit includes the reset circuit 120 having the reset signal terminal VINT and includes the light-emitting circuit 130 connected to the reset circuit 120, the above detection method further includes the following operations.

Step S400: providing a reset control signal to turn on the reset circuit, and providing a crack detection signal to the light-emitting circuit through the reset circuit.

For example, taking the pixel driving circuit shown in FIG. 11 as an example, in step S400, a reset control signal is provided to turn on the reset circuit 120, and the reset control signal can be applied to the second reset terminal RST2, and then the crack detection signal is provided to the light-emitting circuit 130 through the reset circuit 120 that is turned on.

It should be noted that, for a detailed description of the detection method and technical effects, reference may be made to the corresponding description of the working process of the crack detection in the above embodiments, and details are not repeated herein.

The above is only the specific embodiment of the present disclosure, but the scope of the present disclosure is not limited thereto, and the scope of protection of the present disclosure is subject to the scope of protection of the claims.

What is claimed is:

1. A display panel, comprising
a display area and a peripheral area surrounding the display area, wherein
pixel units arranged in an array are disposed in the display area,
each of the pixel units comprises a pixel driving circuit,
a crack detection line is disposed in the peripheral area, and the crack detection line is connected to a reset signal terminal of the pixel driving circuit of at least one pixel unit.

2. The display panel of claim 1, wherein
the pixel driving circuit comprises a reset circuit having the reset signal terminal and comprises a light-emitting circuit connected to the reset circuit, and
the reset circuit is configured to receive from the crack detection line a crack detection signal to cause the light-emitting circuit to emit light.

3. The display panel of claim 2, wherein
the pixel driving circuit further comprises a driving circuit, and the driving circuit is configured to control a driving current for driving the light-emitting circuit to emit light.

4. The display panel of claim 1, wherein the crack detection line is disposed around the display area.

5. The display panel of claim 4, wherein the crack detection line comprises a snake-shaped line, portion.

6. The display panel of claim 4, wherein a plurality of the crack detection lines are disposed in different regions of the peripheral area, and the plurality of the crack detection lines are respectively connected to the reset signal terminals of the pixel driving circuits of different pixel units.

7. The display panel of claim 1, wherein reset signal terminals of pixel driving circuits of at least one row of the pixel units are all connected to a first reset signal line, and the first reset signal line is connected to the crack detection line.

8. The display panel of claim 7, wherein the crack detection line comprises a first portion away from the display area and a second portion close to the display area, and
the first portion and the second portion are parallel with each other, and the first reset signal line is connected to the second portion of the crack detection line.

9. The display panel of claim 7, wherein in the display area, except the at least one row of the pixel units electrically connected to the crack detection line, each row of pixel units is correspondingly provided with a second reset signal line, and the second reset signal line is connected to reset signal terminals of pixel driving circuits of the each row of pixel units.

10. The display panel of claim 9, wherein the crack detection line comprises a crack detection terminal disposed on one side of a bonding area in the peripheral area, and the crack detection terminal is configured to receive a crack detecting signal, and the first reset signal line is closer to the crack detection terminal than the second reset signal line.

11. The display panel of claim 10, further comprising a reset common line, wherein the reset common line is connected to the second reset signal line.

12. The display panel of claim 11, wherein the reset common line is connected to the crack detection terminal.

13. The display panel of claim 7, wherein the crack detection line is disposed around the display area.

14. The display panel of claim 13, wherein the crack detection line comprises a snake-shaped line portion.

15. The display panel of claim 13, wherein a plurality of the crack detection lines are disposed in different regions of the peripheral area, and the plurality of the crack detection lines are respectively connected to the reset signal terminals of the pixel driving circuits of different pixel units.

16. The display panel of claim 1, wherein the crack detection line is provided in a gate metal layer, a source-drain metal layer of a driving transistor of the pixel driving circuit.

17. A display device, comprising the display panel of claim 1.

18. A method of detecting the display panel of claim 1, comprising:

providing the crack detection signal to the reset signal terminal of the pixel driving circuit in the at least one pixel unit through the crack detection line; and observing whether the display panel presents a dark line during display.

19. The method of claim 18, further comprising:

in a case where the display panel comprises the first reset signal line, the crack detection signal is supplied to the reset signal terminal of the pixel unit not connected to the first reset signal line.

20. The method of claim 18, further comprising:

in a case where the pixel driving circuit comprises a reset circuit having the reset signal terminal and comprises a light-emitting circuit connected to the reset circuit, a reset control signal is provided to turn on the reset circuit, and the crack detection signal is provided to the light-emitting circuit by the reset circuit.

* * * * *